United States Patent [19]
Jongsma

[11] Patent Number: 4,718,111
[45] Date of Patent: Jan. 5, 1988

[54] ARRANGEMENT FOR COMBINING THE OUTPUT SIGNALS FROM A PLURALITY OF TRANSMITTERS TUNED TO THE SAME FREQUENCY

[75] Inventor: Wiegard Jongsma, Enschede, Netherlands

[73] Assignee: Hollandse Signaalapparaten B.V., Hengelo, Netherlands

[21] Appl. No.: 755,746

[22] Filed: Jul. 16, 1985

[30] Foreign Application Priority Data

Aug. 28, 1984 [NL] Netherlands .................. 8402613

[51] Int. Cl.$^4$ ............................................. H04B 1/02
[52] U.S. Cl. ........................................ 455/105; 455/52; 330/124 R
[58] Field of Search .............. 455/103, 104, 105, 52, 455/139; 330/53, 124 R

[56] References Cited

U.S. PATENT DOCUMENTS

| | | | |
|---|---|---|---|
| 2,905,813 | 9/1959 | Protze | 455/105 |
| 3,021,490 | 2/1962 | Kompfner . | |
| 3,754,188 | 8/1973 | Wilkens | 455/105 |
| 3,965,422 | 6/1976 | Tagliaferri | 455/52 |
| 4,010,426 | 3/1977 | Rambo | 330/53 |
| 4,064,464 | 12/1977 | Morse | 330/124 R |
| 4,387,347 | 6/1983 | Pierrot | 331/1 R |
| 4,392,252 | 7/1983 | Cluniat | 330/124 R |

FOREIGN PATENT DOCUMENTS 1133009 10/1966 United Kingdom .
1114889 11/1966 United Kingdom .
1294907  5/1970 United Kingdom .

Primary Examiner—Robert L. Griffin
Assistant Examiner—Elissa Seidenglanz
Attorney, Agent, or Firm—Robert J. Kraus

[57] ABSTRACT

An arrangement for combining the output signals from a plurality of transmission units (2, 3) tuned to the same frequency and included in the arrangement, while each arrangement is by itself capable of functioning as a transmission unit (2) whose output signal can be combined with that of another transmission unit (3). For each pair of transmission units (2, 3) to be combined the arrangement incorporates control circuitry (5) for generating a control signal used to effect combination of the output signals of the pair of transmission units (2, 3) in phase. The control circuitry (5) includes a sum and difference network (6) connected to the transmission units (2, 3) and a detector (7), for example a phase-sensitive detector, for deriving the control signal from the output signals of the sum and difference network (6), the sign of the control signal being of special importance.

11 Claims, 5 Drawing Figures

ARRANGEMENT FOR COMBINING THE OUTPUT SIGNALS FROM A PLURALITY OF TRANSMITTERS TUNED TO THE SAME FREQUENCY

BACKGROUND OF THE INVENTION

The invention relates to an arrangement for combining the output signals from a plurality of transmission units tuned to the same frequency and included in the arrangement, and comprises for each pair of transmission unit control circuitry for generating a control signal used to combine the output signals of the two transmission units in phase. If two output signals are combined to form one signal $\Sigma$, a first condition for maximum power of the $\Sigma$ signal, i.e. the sum of the power levels of the two output signals, is that the pair of output signals to be combined be of the same frequency. A second condition for a maximum power level of the $\Sigma$ signal is that the power levels of the two output signals to be combined be equal to one another. A third, final condition for a maximum power level of the $\Sigma$ signal is that the reduced phase difference $\phi$ of the output signals to be combined is 0°. The first condition is fulfilled simply by controlling the two transmission units, whose output signals are to be combined, with a common frequency control signal. The second condition is fulfilled simply by ensuring that the two transmission units, whose output signals are to be combined, are identical to each other. The problem is now confined to the minimization of the reduced phase difference $\phi$. An arrangement to minimize $\phi$ is known from Dutch patent application No. 6614897. The latter arrangement has however the disadvantage that the output signals in question are first detected and corrected for any phase difference $\phi$ and subsequently combined to form one signal.

Any phase error arising after the detection of a phase error by a detection element, for example due to differences in delay of the output signals to be combined, is no longer detected and corrected. Also phase errors arise due to a poor standing wave ratio at the input of the detection element and due to a DC bias and phase offset in the detection element. In this way, a phase error in the order of 30° may even be incurred without making due correction for such an error.

SUMMARY OF THE INVENTION

The present invention has for its object to obviate these disadvantages, whereby the control circuitry comprises a sum and difference network connected to the transmission units, and a detector connected thereto for determining the control signal from the output signals of the sum and difference network, while each arrangement for combining output signals of a plurality of transmission units, tuned to the same frequency and included in the arrangement, is by itself capable of functioning as transmission unit, whose output signal can be combined with that of one of the transmission units.

The arrangement according to the invention can still be improved upon if this arrangement is provided with a memory to store the amplitude of the control signals, with the aid of which signals the output signals of the particular two transmission units have been fully combined in phase for one or several frequencies, whereby after an interruption in the supply of the output signals or the control signals, or with the change-over to a different frequency the control signals pertaining to a desired frequency can be adjusted directly after readout of the memory.

An advantageous embodiment of the arrangement is obtained if each two transmission units, whose output signals are combined, are of equal power; this is a condition for a maximum $\Sigma$ signal. A specially attractive embodiment of the arrangement is realized if each two transmission units, whose output signals are combined, are of equivalent design. The latter is especially of importance to the combination of more than two transmission units; in such a case, it is necessary to use a number of $2^n$ (n=1, 2, 3, . . . ) equivalent transmission units, which as a first step are combined in pairs to form new transmission units, and to repeat this step for the new transmission units until one common $\Sigma$ signal is obtained. This is economically advantageous, since use is made of $2^n$ (n=1, 2, 3, . . . ) equivalent transmission units, and also advantageous to the $\Sigma$ signal, since with each step equal power levels are combined.

BRIEF DESCRIPTION OF THE DRAWING

Other advantages and features of the present invention will now be described with reference to the accompanying drawing figures, in which.

DESCRIPTION OF THE PREFERRED EMBODIMENTS

Figure 1:
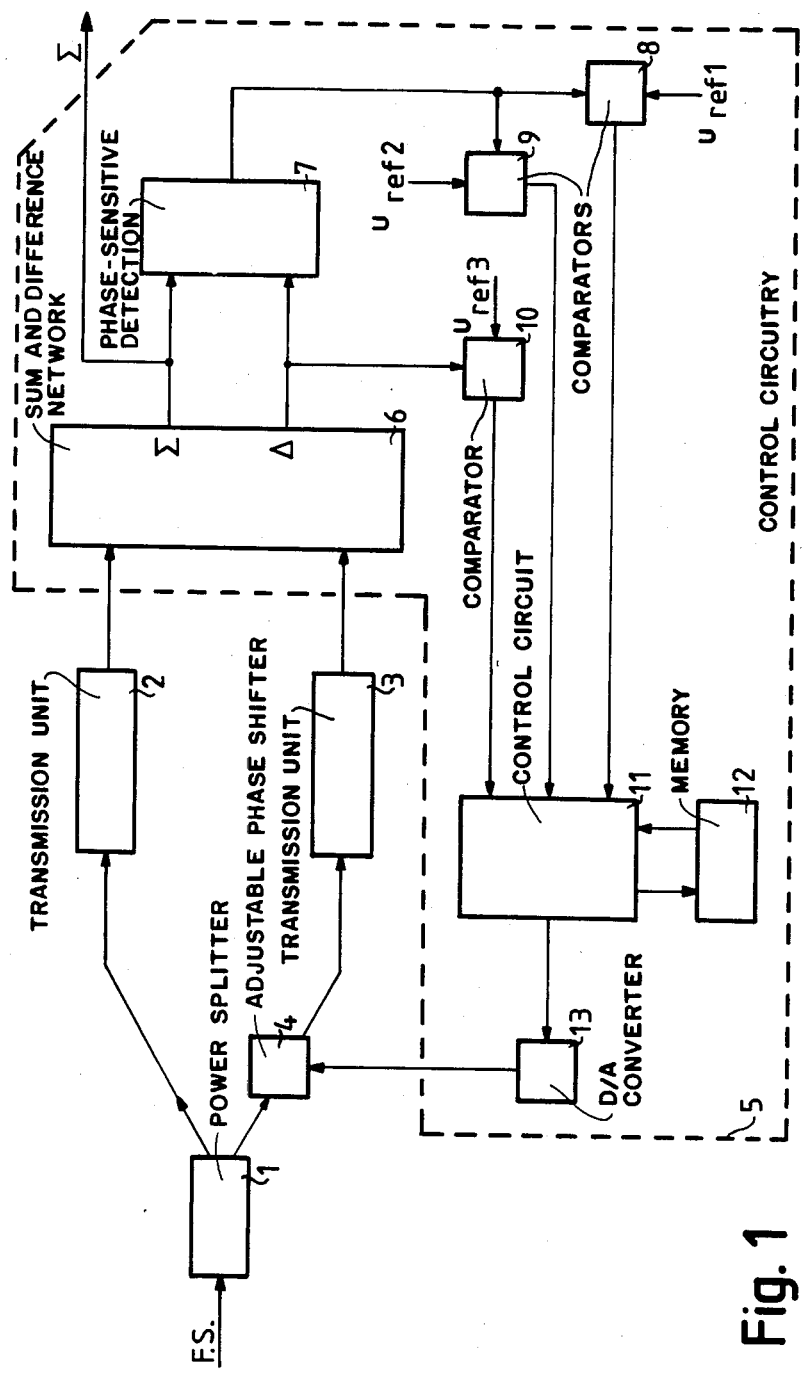
FIG. 1 is a simplified diagram of the arrangement according to a feasible embodiment of the invention.

In this arrangement of FIG. 1 two transmission units 2 and 3 are supplied with a frequency control signal F.S. passing through a power splitter 1 to bring the two transmission units to the same frequency. To adjust the combined signal of the output signals of transmission units 2 and 3 for a maximum value. the supply line to one of the two transmission units incorporates an adjustable phase shifter 4 that is controlled by control circuitry 5. Control circuitry 5 comprises a sum and difference network 6 connected to the two transmission units 2 and 3 for generating the sum signal $\Sigma$ (being the combined transmission signal) and the difference signal $\Delta$ of the two output signals. Assuming that the output ssignal of transmission unit 2 is of amplitude A and the output signal of transmission unit 3 of amplitude B with a relative phase difference $\phi$ with respect to transmission unit 2, the amplitude $|\Sigma|$ of the sum signal $\Sigma$ becomes:

$$|\Sigma| = \sqrt{\tfrac{1}{2}A^2 + \tfrac{1}{2}B^2 + AB\cos\phi}\ ;$$

and the amplitude $|\Delta|$ of the $\Delta$ signal:

$$|\Delta| = \sqrt{\tfrac{1}{2}A^2 + \tfrac{1}{2}B^2 - AB\cos\phi}\ .$$

Figure 2A:
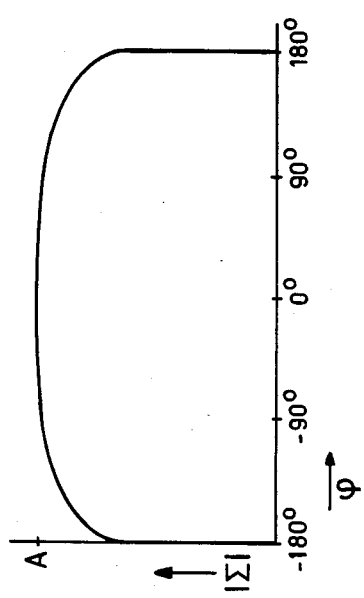
FIG. 2a is a diagram of the power of the sum signal $\Sigma$ as a function of $\phi$.
Figure 2B:
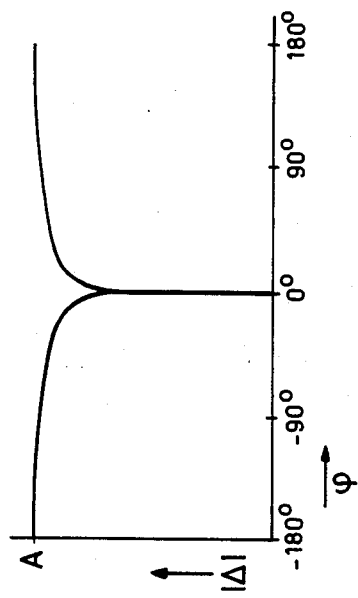
FIG. 2b is a diagram of the power of the difference signal $\Delta$ as a function of $\phi$.
Figure 2C:
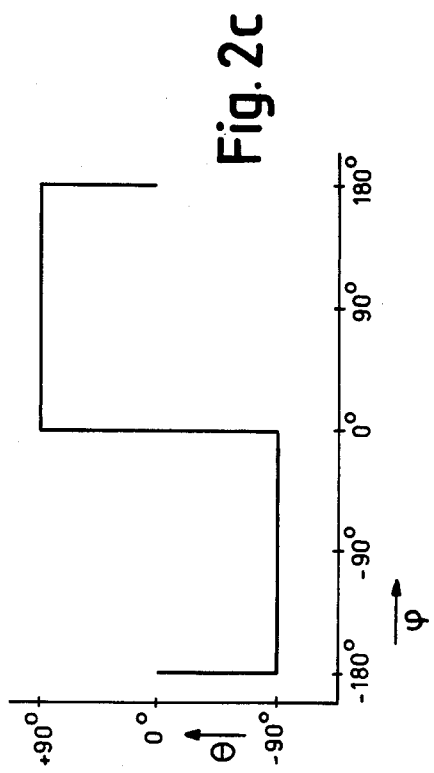
FIG. 2c is a diagram of the phase difference of the $\Sigma$ and $\Delta$ signals as a function of $\phi$.

With the conditions A=B and $\phi=0°$, the amplitude of the $\Delta$ signal is zero and that of the $\Sigma$ signal is a maximum. The first condition is fulfilled if transmission units 2 and 3 are identical; the characteristics of the associated amplitude functions $\Sigma$ and $\Delta$ are shown in FIGS. 2a and 2b. The phase difference $\theta$ between the $\Sigma$ signal and the $\Delta$ signal, where under the first condition $$\theta = \arctan\frac{\sin\phi}{1+\cos\phi} + \arctan\frac{\sin\phi}{1-\cos\phi},$$

then becomes: $\theta=90°$ if $0<\phi<180°$ and $\theta=-90°$ if $-180°<\phi<0°$; see also FIG. 2c.

For $0<\phi<180°$, where a negative correction value is applied to adjust the phase difference $\phi$, $\sin\theta$ is positive. However, for $-180°<\phi<0°$, where a positive correction value is applied to adjust the phase difference $\phi$, $\sin\theta$ is negative. Hence, the polarity of $\sin\theta$ can be utilised to establish the polarity of the correction value used. This is the principle of operation of control circuitry 5, which is provided with a phase-sensitive detector 7, connected to the sum and difference network 6 for determining the polarity of $\sin\theta$ from the $\Delta$ signal and a branched part of the $\Sigma$ signal.

With the use of a phase-sensitive detector 7 of the type having an output signal $U=k\cdot|\Sigma|\cdot|\Delta|\cdot\sin\theta$, the $U=k'\sin\phi$ output signal is obtained after substitution; from this it is found that the output signal, apart from containing a polarity-determining factor for the phase correction, is also a measure of the phase difference $\phi$.

Output signal U is applied to a first comparator 8, forming part of control circuitry 5, for comparison with a first reference value ($U_{ref1}$) to establish whether the control value of phase shifter 4 has to be corrected by a positive or a negative value. Control circuitry 5 further comprises a second comparator 9 to establish by comparison with a second reference signal ($U_{ref2}$) whether the output voltage U is of a sufficiently small value and thus is still within the desired degree of accuracy.

The control criterion is however unsuitable for phase differences of $\phi$ approximating $\pm 180°$, as in such a situation comparator 9 also indicates that the phase difference is brought within the desired degree of accuracy. The difference between the situations for $\phi=0°$ and $\phi=\pm 180°$ is however obtained from the $\Delta$ signal. If $\phi=0°$, the $\Delta$ signal will be zero and if $\phi=\pm 180°$, the $\Delta$ signal will be a maximum. To this effect, control circuitry 5 is also provided with a comparator 10 supplied with the $\Delta$ signal of the sum and difference network 6, and activated at a certain reference value ($U_{ref3}$). From the output signals of comparators 9 and 10 a control circuit 11 establishes whether the control value of phase shifter 4 must be changed; if so, a new control value of phase shifter 4 is established from successive approximations with the aid of first comparator 8 and control circuitry 5. The control value used is stored in a memory 12. A control value from control circuit 11 is expressed in binary notation, and is applied to a D/A converter 13 for conversion into an analog signal voltage for controlling the analog phase shifter. Phase shifter 4 is adjustable for the setting of several frequencies in succession, storing the associated control values in memory 12; hence, with a temporary interruption in the supply of the transmission signals or in the control signals due to a failure or the change-over to a different frequency, the control signals pertaining to the desired frequency can be read out of memory 12 and directly set to the desired value. With a pulse-shaped output signal, the phase difference $\phi$ is controlled during the pulse period, while the amplitude of the associated control signals is kept constant and stored in memory to produce the correct control signals with the next pulse without incurring a settling period.

If at a certain frequency the phase difference $\phi$ is outside the second or third reference value, for instance through temperature variations, the control signal is readjusted and the magnitude of the signal is stored in memory.

An advantage of the arrangement according to the invention is that the phase-sensitive detector 7 is situated behind the sum and difference network 6. If for example between the inputs of the phase-sensitive detector 7 a phase error arises through a poor standing-wave ratio, the amplitude of the output signal of phase-sensitive detector 7 will change; the position of the zero point of $\sin\theta$ however does not change, so there will be no systematic error in the control of $\phi$, as the control proceeds on the basis of the sign of $\sin\theta$. Also the effect of a DC bias in the phase-sensitive detector 7 is lesss pronounced, since the phase $\phi$ is adjusted for zero. The fact that the phase-sensitive detector 7 may be of such a design that its output signal is $|\Delta|\sin\theta$, where $|\Sigma|$ functions as a reference signal (LO signal) and must therefore be constant. Since $\phi$ is adjusted for zero, $|\Sigma|$ will indeed be substantially constant (see FIG. 2a). Moreover, the $\Delta$ signal will tend to zero when $\phi$ tends to zero (see FIG. 2b), so that the DC bias, being proportional to $\Delta$, in the phase-sensitive detector 7 also tends to zero. Also phase errors due to errors incurred with the combination of the output signals of the transmitters will be corrected, as the phase detection is performed after the combination of the output signals.

Figure 3:
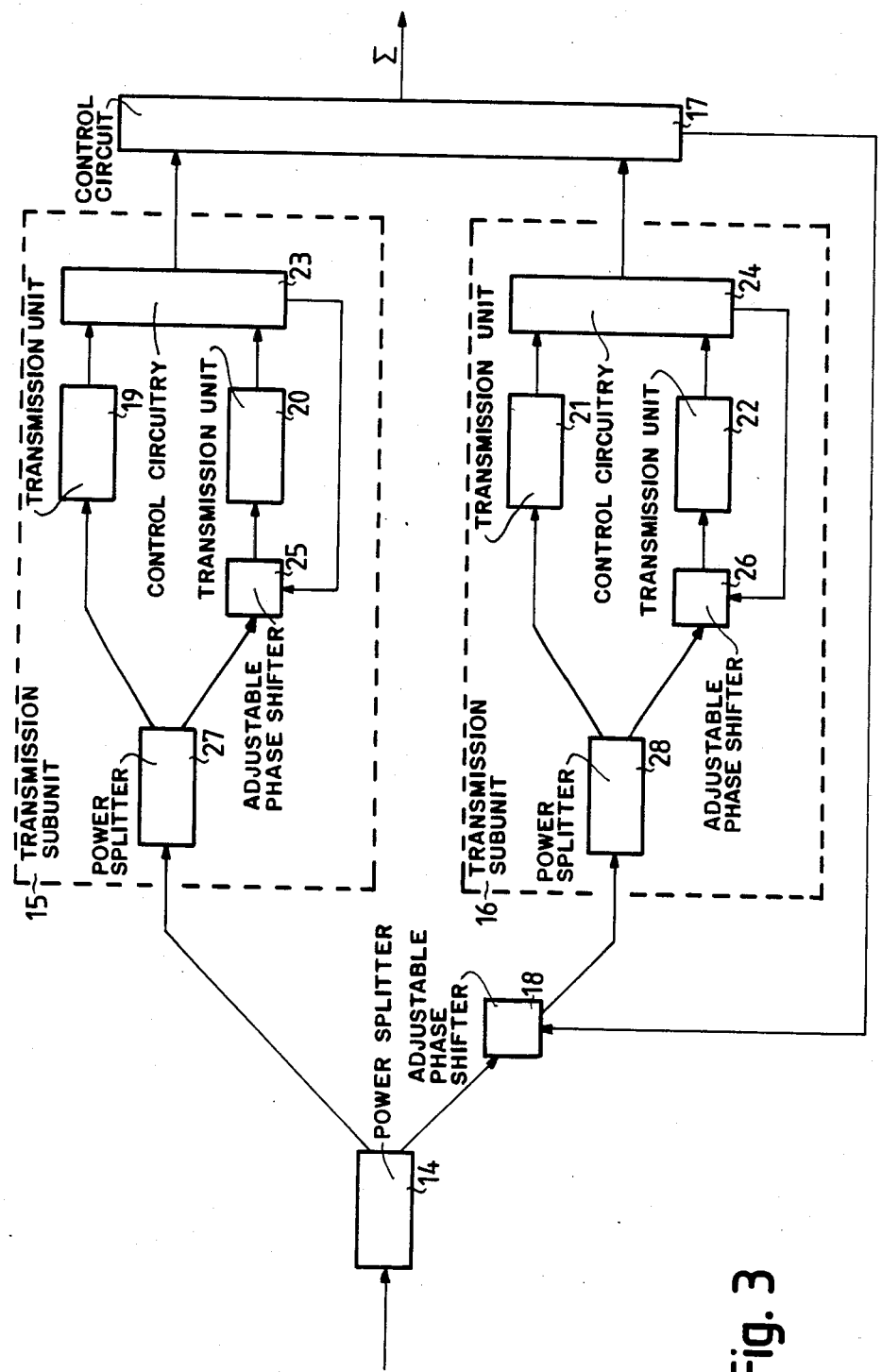
FIG. 3 is a simplified diagram for the combination of four transmission units according to the invention.

The arrangement described above is eminently suited for creating a composite arrangement having the characteristics defined by the present invention, using at least arrangements of corresponding design. In such a composite arrangement, each arrangement as described above with reference to FIG. 1 may in turn be construed as a transmission subunit. Since the maximum $\Sigma$ signal is obtained from two transmission units to be combined if, amongst others, the two power levels or amplitude of the output signals of the pair of transmission units are the same, it is of advantage to select $2^n$ identical elementary transmission units and to combine these as indicated in FIG. 3 for $n=2$. In the arrangement of FIG. 3 two transmission subunits 15 and 16 operating as transmission unit, are supplied with a frequency control signal F.S, via a power splitter 14, to bring the two transmission subunits to the same frequency. To adjust for a maximum value of the combined signal obtained from transmission subunits 15 and 16, the arrangement comprises a control circuit 17 for the setting of an adjustable phase shifter 18 in the supply line to one of the two transmission subunits 15 and 16. Control circuit 17 also supplies the combined output signal $\Sigma$. Each of the transmission subunits 15 and 16 is in turn designed as described in FIG. 1. Therefore, in each of the subunits 15 and 16 a frequency control signal F.S. obtained from power splitters 27 and 28 is supplied respectively to two elementary transmission units 19, 20 and 21, 22 to equalize the frequency of the elementary transmission units therein. To adjust each transmission subunit for the maximum value of the combined signal obtained from the output signals of the separate elementary transmission units 19, 20 and 21, 22 respectively, the transmission subunits 15 and 16 comprises control circuitries 23 and 24, respectively, for the setting of adjustable phase shifters, 25 and 26, respectively, in the supply lines to the two elementary transmission units 20 and 22, respectively. Each of control circuitries 23 and 24 supplies the combined output signal of the transmission subunits 15 and 16, respectively. The arrangement of FIG. 3 may in turn be extended to form an arrangement for combining output signals of $2^n$ elementary transmission units (n=3, 4, ...), whereby as a first step the entire arrangement of FIG. 3 should be regarded as one transmission subunit to be combined in turn with the same transmission subunit to produce an arrangement of eight identical elementary transmission units. This step must subsequently be repeated until the desired number of elementary transmission units has been attained.

I claim:

1. An arrangement for combining in phase the output signals from a pair of transmission units tuned to the same frequency, said arrangement including means for minimizing the phase difference of said signals, comprising:
    (a) a sum and difference network electrically connected to the pair of transmission units for producing sum and difference signals from the output signals of the pair of transmission units;
    (b) a detector electrically connected to said network for producing from the sum and difference signals a phase control signal representative of any phase difference between said output signals; and
    (c) phase control means electrically connected to the detector and to at least one of the transmission units for controlling said phase difference in response to said control signal.

2. An arrangement as in claim 1, characterized in that the detector comprises a phase-sensitive detector, and that the phase control means comprises a control unit for deriving the control signal from the polarity of the output signal of the phase-sensitive detector.

3. An arrangement as in claim 2, characterized in that the control unit comprises:
    (a) a first comparator having respective inputs for receiving the output signal of the phase-sensitive detector and a first reference signal;
    (b) a second comparator having respective inputs for receiving the output signal of the phase-sensitive detector and a second reference signal;
    (c) a control circuit electrically connected to outputs of the first and second comparators for producing a series of different iterative control signals such that the phase difference between the output signals of the pair of transmission units is within the value of the second reference signal and to keep the amplitude of the control signal constant as long as the phase difference remains within the value of the second reference signal.

4. An arrangement as in claim 3, characterized in that said series of different control signals is produced according to the principle of successive approximation.

5. An arrangement as in claim 2 or 3, characterized in that the phase-sensitive detector comprises a gate circuit for discriminating between a phase difference of 0° or 180° between the output signals of the pair of transmission units.

6. An arrangement as in claim 1, 2, 3 or 4, including a power splitter for dividing a frequency control signal supplied to the arrangement into two parts for supply to the pair of transmission units.

7. An arrangement as in claim 6, characterized in that at least one phase shifter is electrically connected between the power splitter and one of the pair of transmission unit, said phase shifter operating in response to the phase control signal.

8. An arrangement as in claim 1, 2, 3 or 4, characterized in that the arrangement comprises a memory for storing the control signal amplitudes, whereby each control signal is used for combining the output signals of the pair of transmission units fully in phase for a certain frequency, and whereby after an interruption in the supply of said signal, or with the change-over of the transmission units from one frequency to another frequency, the control signals pertaining to the desired frequency are adjustable directly after readout of the memory.

9. An arrangement as in claim 1, 2, 3 or 4, comprising a plurality of pairs of transmission units and associated control circuitry including the respective sum and difference network, detector and phase control means, the output signal of each pair being combined with that of another pair by means of an additional one of said control circuitries.

10. An arrangement as in claim 1, 2, 3 or 4 where the transmission units in the pair of transmission units each produce output signals having substantially equal power.

11. An arrangement as in claim 10 where the transmission units in the pair of transmission units are substantially identical.

* * * * *